United States Patent [19]
Kawada

[11] Patent Number: 6,119,865
[45] Date of Patent: Sep. 19, 2000

[54] ACCOMMODATION CONTAINER AND ACCOMMODATING METHOD

[75] Inventor: Seiichi Kawada, Tokyo, Japan

[73] Assignee: Oki Electric Industry Co., Ltd., Tokyo, Japan

[21] Appl. No.: 09/247,075

[22] Filed: Feb. 9, 1999

[30] Foreign Application Priority Data

Nov. 12, 1998  [JP]  Japan .................................. 10-322164

[51] Int. Cl.⁷ ................................................... B65D 85/30
[52] U.S. Cl. ........................... 206/710; 206/303; 206/454
[58] Field of Search .................................. 206/303, 454, 206/710, 711, 720

[56] References Cited

U.S. PATENT DOCUMENTS

| | | | |
|---|---|---|---|
| 4,787,508 | 11/1988 | Wu et al. ................................ | 206/710 |
| 4,792,044 | 12/1988 | Nishizawa et al. ..................... | 206/303 |
| 5,095,626 | 3/1992 | Kitamura et al. ....................... | 206/720 |
| 5,240,753 | 8/1993 | Tabuchi et al. ......................... | 206/711 |
| 5,366,079 | 11/1994 | Lin et al. ................................ | 206/303 |
| 5,553,711 | 9/1996 | Lin et al. ................................ | 206/710 |
| 5,642,813 | 7/1997 | Nyseth .................................... | 206/710 |
| 5,724,748 | 3/1998 | Brooks et al. .......................... | 206/711 |

FOREIGN PATENT DOCUMENTS

| | | |
|---|---|---|
| 5-28043 | 4/1993 | Japan . |
| 6-38245 | 5/1994 | Japan . |
| 9-27543 | 1/1997 | Japan . |
| 9-86588 | 3/1997 | Japan . |
| 9-246369 | 9/1997 | Japan . |

*Primary Examiner*—David T. Fidei
*Attorney, Agent, or Firm*—Rabin & Champagne, PC

[57] ABSTRACT

An accommodation container comprises an accommodation container body, a plurality of frames accommodated in the accommodation container body, wherein each frame is composed of a frame body and an adhesive sheet fixed to and disposed inside the frame body, and wherein the plurality frames are disposed so that joining adhesive sheets are spaced at given intervals. With the construction of the accommodation container, it is possible to restrain the adhesive sheets from being bonded to other articles by shock and vibration during the transportation thereof when the plurality of the wafer products each provided with a frame are accommodated in the accommodation container.

20 Claims, 5 Drawing Sheets

ACCOMMODATION CONTAINER AND ACCOMMODATING METHOD

BACKGROUND OF THE INVENTION

1. Field of the Invention

The invention relates to an accommodation container for accommodating articles such as semiconductor wafers and an accommodating method.

2. Prior Art

There are wafer assemblies provided with frames in a conventional technique of this field. The wafer assemblies are prepared by bonding articles such as wafers to adhesive sheets which are bonded to metallic frames and dividing the wafers into individual pieces.

However, there is no established system of a container for accommodating wafer assemblies each provided with a frame.

SUMMARY OF THE INVENTION

It is an object of the invention to provide an accommodation container capable of restraining an adhesive sheet from being bonded to other articles by shocks, vibrations, or the like during transportation when a plurality of wafer assemblies each provided with a frame are accommodated in the accommodation container.

It is another object of the invention to control the viscosity of the adhesive sheet so that it does not lower by the change of an external temperature.

To achieve the above objects, the accommodation container of the invention comprises an accommodation container body, a plurality of frames accommodated in the accommodation container body, wherein each frame is composed of a frame body and an adhesive sheet fixed to and disposed inside the frame body, and wherein the plurality frames are disposed so that joining adhesive sheets are spaced at given intervals.

The accommodation container of the invention has another construction comprising an accommodation container body having a heat insulator therein, and a plurality of frames accommodated in the accommodation container body, wherein each frame is composed of a frame body and an adhesive sheet fixed to and disposed inside the frame body.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

PREFERRED EMBODIMENT OF THE INVENTION

The first embodiment of the invention will be now described with reference to FIGS. 1 to 3.

Figure 1:
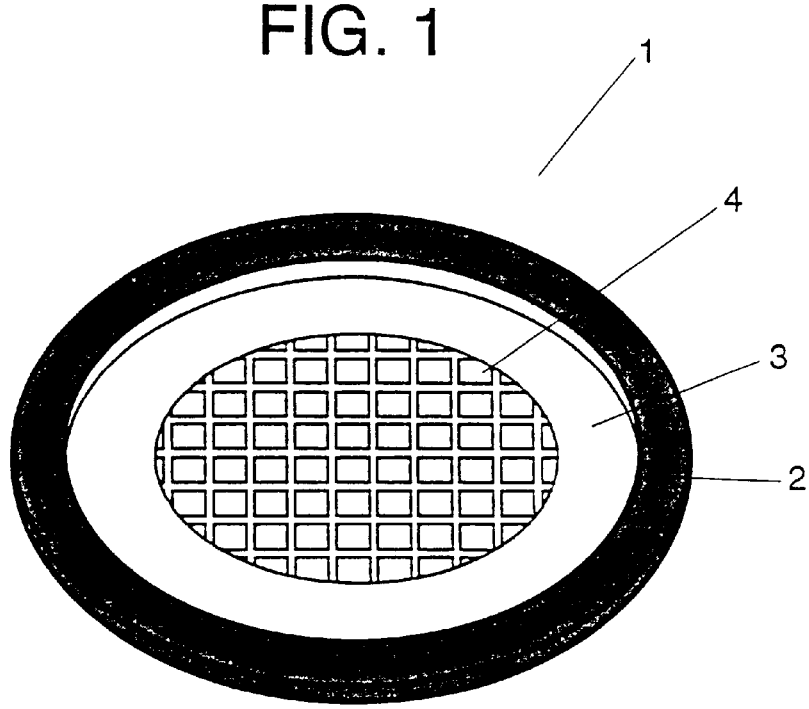
FIG. 1 is a view showing a first embodiment of the invention.
Figure 2:
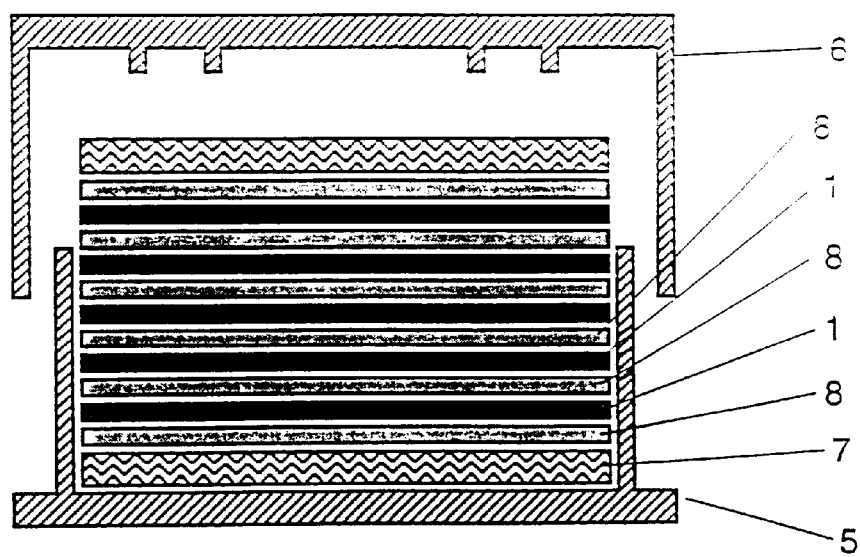
FIG. 2 is a view showing the first embodiment of the invention.
Figure 3:
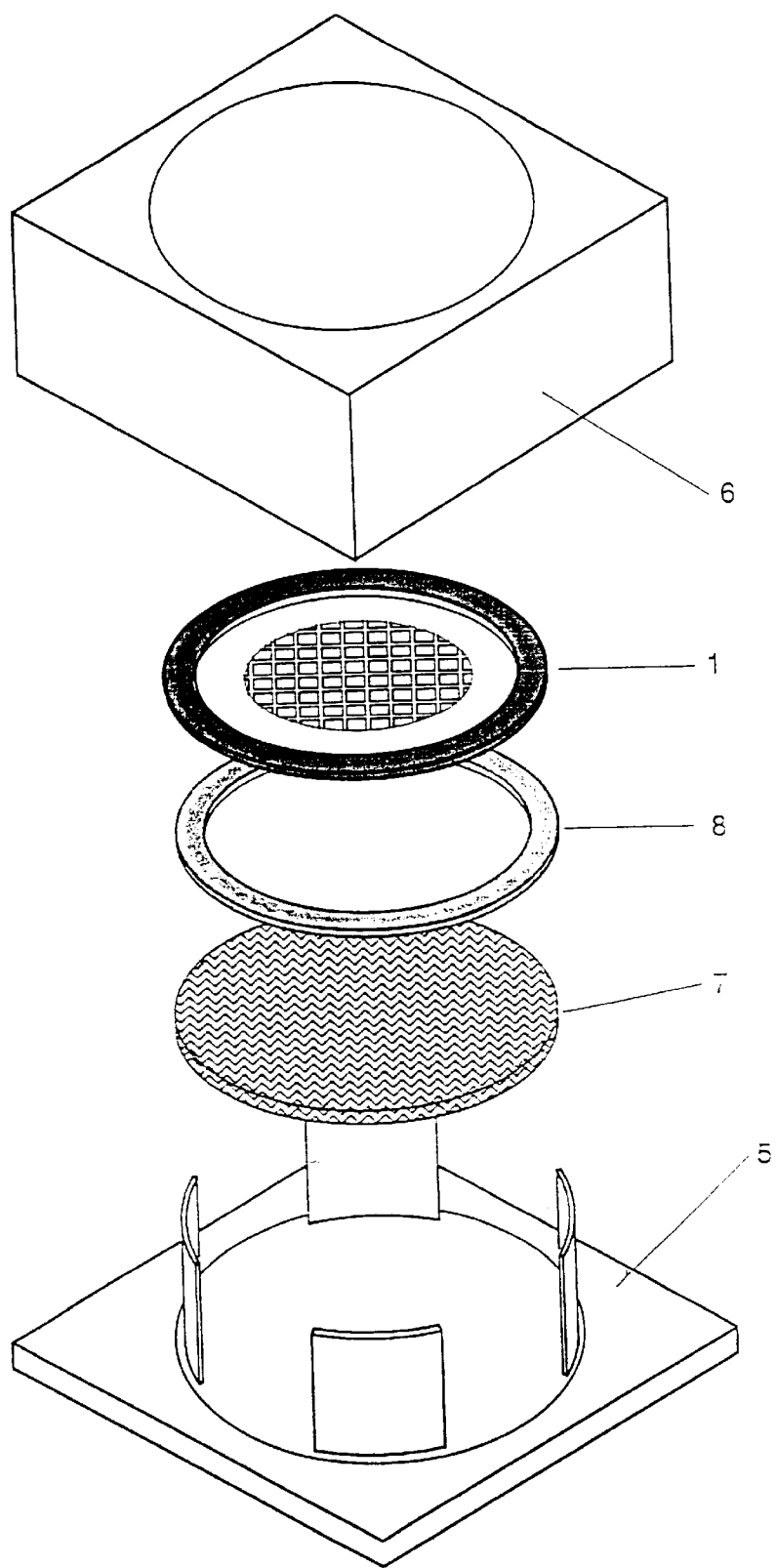
FIG. 3 is a view showing the first embodiment of the invention.

FIG. 1 shows a wafer assembly provided with a frame, FIG. 2 is a sectional view showing a state where the wafer assembly each provided with a frame in FIG. 1 are accommodated in an accommodation container, and FIG. 3 is a perspective view showing a state where the wafer assembly provided with a frame in FIG. 1 is accommodated in an accommodation container.

In FIG. 1, a wafer assembly 1 provided with a frame is formed by the following process. First, a metallic wafer frame 2 having an opening is prepared. Then, a wafer product 4 bonded to an adhesive sheet 3 is prepared. The wafer product 4 is in a state of IC chips which are divided into small pieces in advance. That is, the wafer product is bonded to the adhesive sheet 3 and it is divided into individual ICs using a diamond cutter.

The adhesive sheet 3 to which the wafer product 4 is bonded is located in the opening and is bonded to the metallic wafer frame 2 and it is cut along the periphery of the metallic wafer frame 2 to obtain the wafer assembly 1 provided with a frame.

Subsequently, as shown in FIGS. 2 and 3, such a wafer assembly 1 provided with a frame is accommodated in an accommodation container. The accommodation container comprises an accommodation container body 5 and an accommodation container cover 6. The wafer assembly 1 provided with a frame is accommodated in the following manner. A shock absorbing member 7 is first inserted into the accommodation container body 5. The shock absorbing member 7 is, for example, formed of a material such as urethane for absorbing an external shock. Then, a spacer 8 having substantially the same shape as the metallic wafer frame 2 (i.e., having an opening) is inserted into the accommodation container body 5. Subsequently, the wafer assembly 1 provided with the metallic wafer frame 2 and the spacer 8 are alternately put one upon another. The opening of the spacer 8 faces the IC chips. A thickness of the spacer 8 is appropriately selectively determined considering a tension of the adhesive sheet 3, and thicknesses of the adhesive sheet 3 and wafer product 4, and the thickness of the metallic wafer frame 2.

The shock absorbing member 7 is placed on the uppermost metallic wafer frame 2 via the spacer 8. Finally, the accommodation container body 5 is covered with the accommodation container cover 6 to fix therebetween. The accommodation container body 5 and the accommodation container cover 6 respectively have a screw-in structure so that they can be easily fixed to each other.

Figure 4:
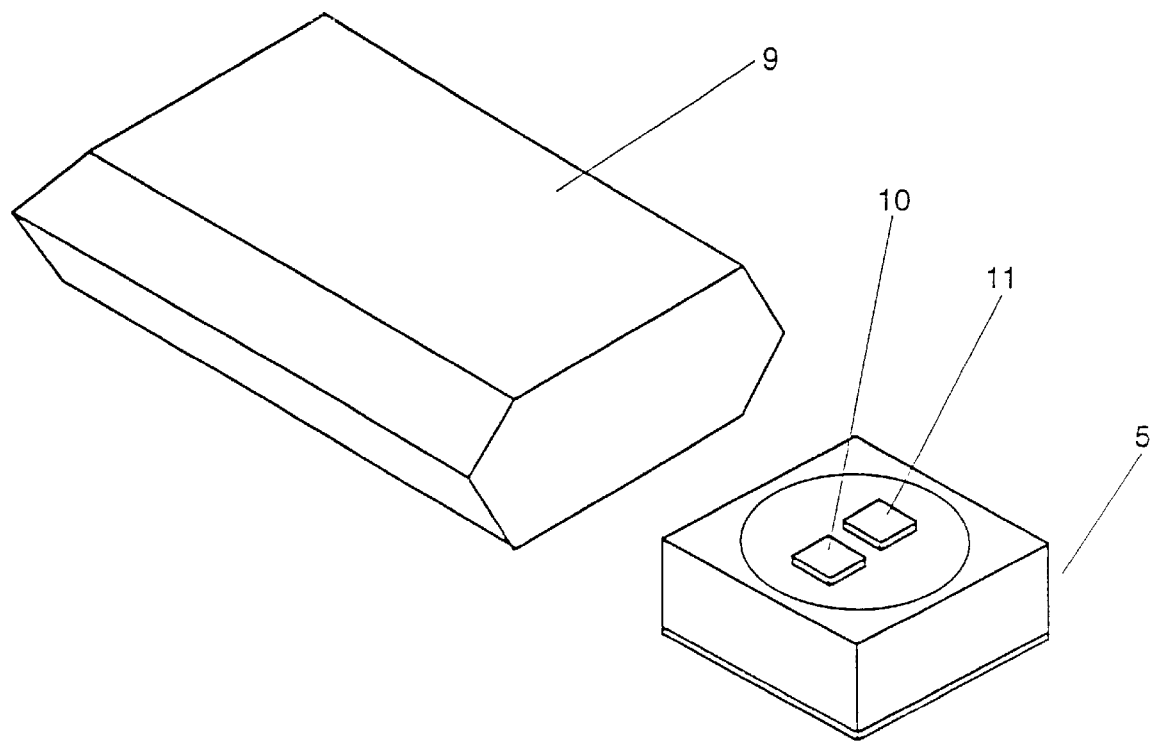
FIG. 4 is a view showing the first embodiment of the invention.

Then, as shown in FIG. 4, the wafer assembly 1 provided with a frame is accommodated in the accommodation container body 5 to which the accommodation container cover 6 is fixed, then the accommodation container is housed in a moistureproofing sack 9. The moistureproofing sack 9 uses a material formed of, for example, an aluminum layer and a polyethylene layer, and serves to prevent moisture from permeating therethrough. A drying agent 10 and a deoxidizing agent 11 are also housed in the moistureproofing sack 9. After the accommodation container, the drying agent 10 and the deoxidizing agent 11 are housed in the moistureproofing sack 9, the inlet of the moistureproofing sack 9 is sealed by a thermal seal to cut it off from an outside-air.

Figure 5:
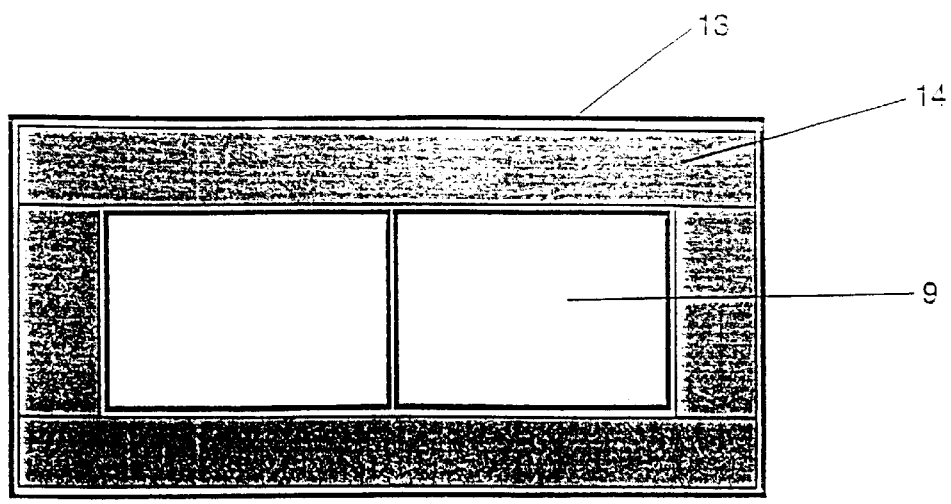
FIG. 5 is a view showing the first embodiment of the invention.

Then, as shown in FIG. 5, the moistureproofing sack 9 in which the accommodation container is housed is placed in a corrugated cardboard box 13. A heat insulator 14 is inserted between the corrugated cardboard box 13 and the moistureproofing sack 9. The heat insulator 14 is formed of a foaming material such as foaming polyethylene. After the heat insulator 14 is housed in the moistureproofing sack 9 so as to cover the entire periphery of the moistureproofing sack 9, the corrugated cardboard box 13 is covered with its cover.

Since the wafer assemblies 1 each provided with a frame are alternately put one upon another via the spacers 8 having the openings, the adhesive sheets 3 and the wafer products 4 do not contact other articles, thereby protecting the wafer products 4.

Further, as shown in FIG. 4, since the articles such as wafer products or individual IC chips prepared by dividing the wafer product into individual pieces are packaged in a moistureproofing state by use of the drying agent 10 and deoxidizing agent 11, they can be prevented from being oxidized or corroded since moisture content and density of oxidation inside the package or the corrugated cardboard box 13 can be restrained.

Further as shown in FIG. 5, the insertion of the heat insulator 14 in the corrugated cardboard box 13 can prevent an inner temperature of the wafer product 4 from increasing and can prevent the viscosity of the adhesive sheet 3 from lowering.

Figure 6:
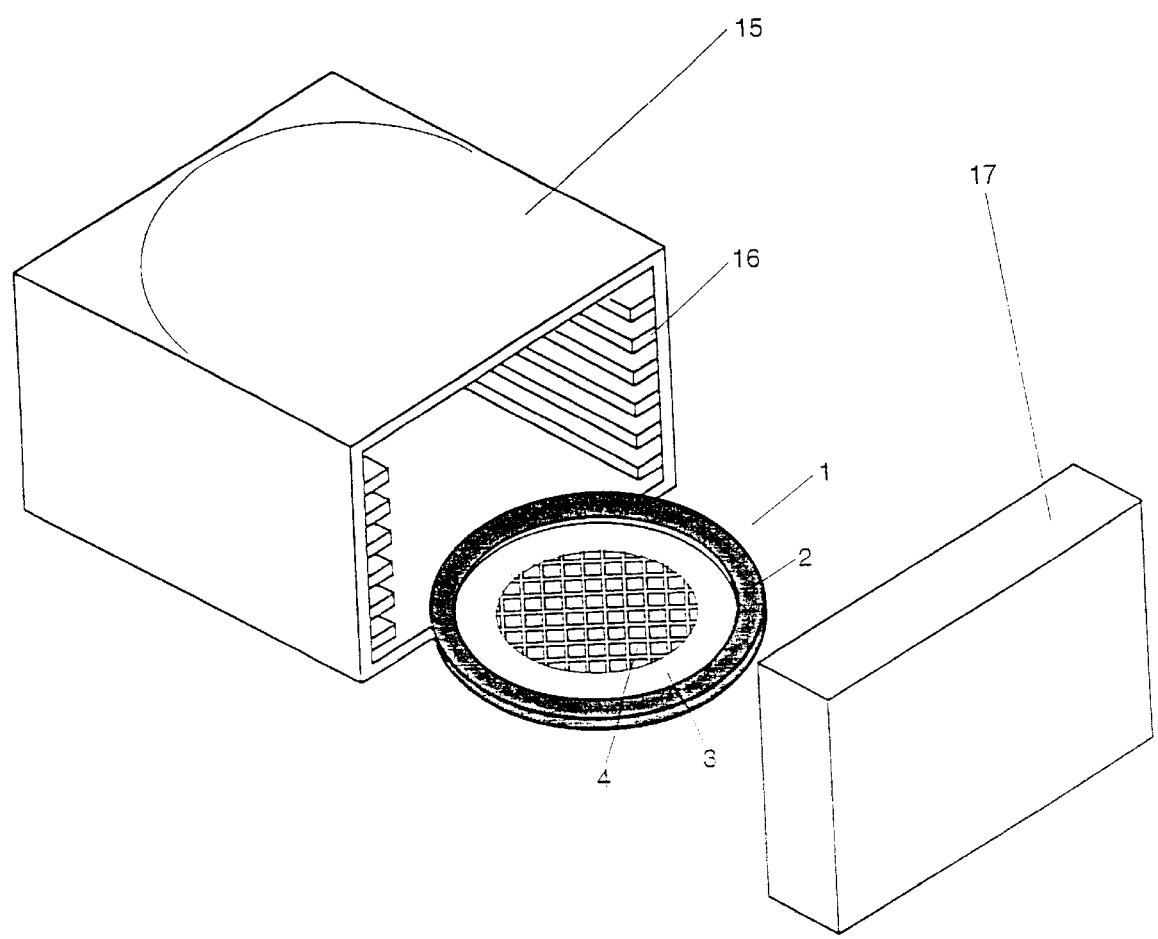
FIG. 6 is a view showing a second embodiment of the invention.

A second embodiment of the invention will be now described with reference to FIG. 6.

Components having the same as those of the first embodiment are denoted by the same reference numerals, and hence the detailed description thereof is omitted.

In the second embodiment, an accommodation container body 15 has a plurality of projections 16 at the inner wall thereof.

Intervals between the projections 16 are appropriately selectively determined considering the tension of the adhesive sheet 3, and thicknesses of the adhesive sheet 3, and the wafer products 4, and the thickness of the metallic frame 2 of the wafer assembly 1 provided with a frame. A plurality of wafer assemblies 1, each provided with a frame are accommodated in the accommodation container body 15, corresponding to the projections 16 of the accommodation container body 15. An accommodation container cover 17 is engaged in the accommodation container body 15 after the wafer assemblies 1 each provided with a frame are accommodated in the accommodation container body 15.

In the case of employment of the accommodation container of the second embodiment, since a plurality of the wafer assemblies 1 each provided with a frame are supported by a plurality of projections 16, the adhesive sheets 3 and the wafer products 4 do not contact the other articles to protect the wafer products 4.

Further, the accommodation container body 15 in which the wafer assemblies 1 each provided with a frame are housed in the moistureproofing sack 9 together with the drying agent 10 and the deoxidizing agent 11 in the same manner as the first embodiment shown in FIGS. 4 and 5, thereafter the moistureproofing sack 9 is housed in the corrugated cardboard box 13 provided with the heat insulator 14, thereby preventing the wafer products 4 from being oxidized and corroded, and preventing the viscosity of the adhesive tapes 3 from being lowered.

A third embodiment of the invention will be now described with reference to FIG. 7. In the third embodiment, the accommodation container body and the accommodation container cover in the first embodiment respectively have a heat insulating structure.

Figure 7:
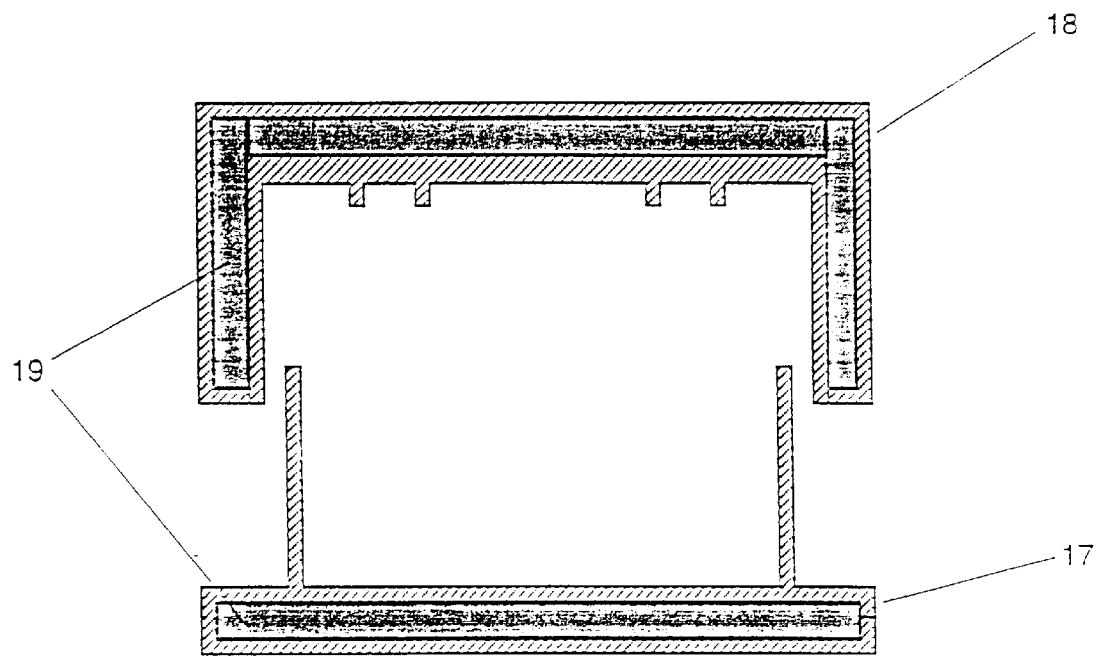
FIG. 7 is a view showing a third embodiment of the invention.

FIG. 7 is a sectional view of the accommodation container body 17 and the accommodation container cover 18.

In FIG. 7, the accommodation container body 17 and the accommodation container cover 18 are respectively double structured and heat insulators 19 are respectively filled in both the double structured accommodation container body 17 and the accommodation container cover 18. The heat insulators 19 can employ a foaming material such as foaming polyethylene.

Shock absorbing members, spacers, wafer assemblies each provided with a frame, respectively not shown, are accommodated in the accommodation container while they are put one upon another in the same manner as the first embodiment, and further, the accommodation container is housed in a moistureproofing sack together with a drying agent and a deoxidizing agent, not shown.

In such a manner, since the wafer assemblies each provided with a frame are accommodated in the accommodation container having a heat insulating structure, they are not needed to be housed in a corrugated cardboard box having the heat insulators therein, so that the viscosity of the adhesive sheet 3 can be prevented from being lowered by the influence of the external temperature, thereby improving workability.

A fourth embodiment of the invention will be described next with reference to FIG. 8.

In the fourth embodiment, the accommodation container body and the accommodation container cover in the second embodiment have respectively heat insulating structure.

Figure 8:
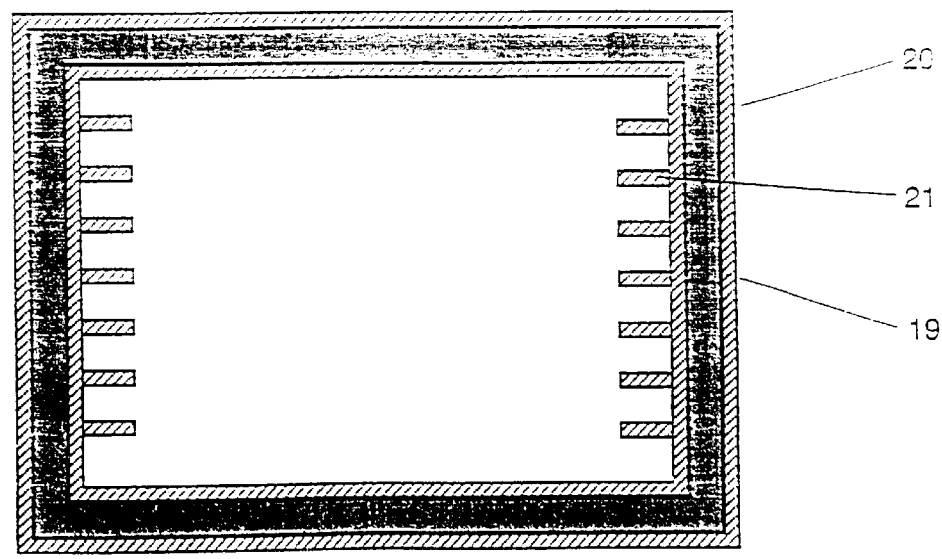
FIG. 8 is a view showing a fourth embodiment of the invention.

FIG. 8 is a sectional view of a accommodation container body 20.

In FIG. 8, the accommodation container body 20 is double structured and a heat insulator 19 is filled in the accommodation container body 20. The heat insulator 19 employs a foaming material such as foaming polyethylene. A plurality of projections 21 are provided on the inner wall of the accommodation container body 20.

Wafer assemblies each provided with a frame, not shown, are accommodated in an accommodation container having the accommodation container body 20 corresponding to the projections 21 in the same manner as the second embodiment. Further, this accommodation container is housed in a moistureproofing sack together with a drying agent and a deoxidizing agent, respectively not shown.

In such a manner, since the wafer products each provided with a frame can be accommodated in the accommodation container having a heat insulating structure, they are not needed to be housed in the corrugated cardboard box having the heat insulator therein, and the viscosity of the adhesive sheet 3 can be prevented from being lowered by the influence of the external temperature, thereby improving workability.

What is claimed is:

1. A combination of an accommodation container and IC chips provided with a frame, comprising:
   a plurality of wafer assemblies each of which has a frame body having a first opening, an adhesive sheet fixed to the frame body at a periphery of the adhesive sheet, and IC chips bonded on the adhesive sheet located at the first opening;

a spacer interposed between adjacent ones of said wafer assemblies and having a second opening facing the IC chips; and an accommodation container which accommodates a stacked structure composed of said wafer assemblies and said spacer.

2. The combination according to claim 1, further comprising:

additional spacers located over and under the stacked structure, respectively; and shock absorbing members located over and under said additional spacers.

3. The combination according to claim 1, wherein said accommodation container includes a heat insulator.

4. The combination according to claim 1, wherein said accommodation container includes an upper container and a lower container, said lower container having a bottom surface and a side surface, said upper container having an upper surface and a side surface covering the side surface of the lower container.

5. The combination according to claim 1, further comprising:

a moisture proofing sack which houses said accommodation container.

6. The combination according to claim 5, further comprising:

a drying agent and a deoxidizing agent which are accommodated in the moisture proofing sack.

7. An accommodating method, comprising:

preparing a plurality of wafer assemblies each of which has an adhesive sheet, a frame body having a first opening, and IC chips, each of the adhesive sheets being fixed to the frame body at a periphery of the adhesive sheet, and the IC chips being bonded on the adhesive sheet located at the first opening;

preparing a spacer having a second opening;

stacking the wafer assemblies on the spacer so that the second opening faces toward the IC chips; and accommodating a stacked structure composed of the wafer assemblies and the spacer in an accommodation container.

8. An accommodating method according to claim 7, further comprising:

housing the accommodation container in a moisture proofing sack.

9. An accommodating method according to claim 8, further comprising:

housing the accommodation container in the moisture proofing sack together with a drying agent and a deoxidizing agent.

10. An accommodation arrangement for wafer products, comprising:

an accommodation container body having a base;

a shock absorbing member disposed in said accommodation container body and in contact with the base;

a spacer disposed in said accommodation container body and directly on said shock absorbing member; and a wafer product disposed in said accommodation container body and on said spacer.

11. The accommodation arrangement recited in claim 10, wherein said shock absorbing member is composed of urethane.

12. The accommodation arrangement recited in claim 10, wherein the base of said accommodation container body has a double wall structure having a heat insulator disposed therein, whereby one of the walls of the double wall structure separates the heat insulator from the shock absorbing member.

13. The accommodation arrangement recited in claim 12, wherein said heat insulator comprises a foaming polyethylene.

14. The accommodation arrangement recited in claim 10, further comprising:

an accommodation container cover positionable over said accommodation container body; and a further shock absorbing member disposed immediately adjacent to said accommodation container cover and over said spacer and said wafer product.

15. The accommodation arrangement recited in claim 14, wherein the accommodation container cover has a double wall structure having a heat insulator disposed therein, whereby one of the walls of the double wall structure separates the heat insulator from the further shock absorbing member.

16. The accommodation arrangement recited in claim 15, wherein the base of said accommodation container body also has a double wall structure having a further heat insulator disposed therein, whereby one of the walls of the double wall structure of said accommodation container body separates the further heat insulator from the shock absorbing member.

17. The accommodation arrangement recited in claim 16, wherein said heat insulator and said further heat insulator comprise a foaming polyethylene.

18. The accommodation arrangement recited in claim 16, wherein said heat insulator and said further heat insulator collectively surround said shock absorbing member, said spacer, said wafer product and said further shock absorbing member.

19. The accommodation arrangement recited in claim 14, further comprising at least one further spacer disposed over said wafer product and in direct contact with said further shock absorbing member.

20. The accommodation arrangement recited in claim 10, further comprising a wafer assembly comprised of an adhesive sheet, a frame, and the wafer product bonded to the frame using the adhesive sheet.

* * * * *